United States Patent
Kim et al.

(10) Patent No.: US 9,237,654 B2
(45) Date of Patent: Jan. 12, 2016

(54) ELECTRONIC COMPONENT EMBEDDED SUBSTRATE

(71) Applicant: Samsung Electro-Mechanics Co., Ltd., Suwon (KR)

(72) Inventors: Hong-Won Kim, Suwon (KR); Keun-Yong Lee, Suwon (KR); Young-Do Kweon, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 150 days.

(21) Appl. No.: 14/206,254

(22) Filed: Mar. 12, 2014

(65) Prior Publication Data

US 2015/0189757 A1    Jul. 2, 2015

(30) Foreign Application Priority Data

Dec. 31, 2013  (KR) .................. 10-2013-0169246

(51) Int. Cl.
*H05K 1/18* (2006.01)
*H05K 3/46* (2006.01)

(52) U.S. Cl.
CPC .............. *H05K 1/185* (2013.01); *H05K 3/4602* (2013.01); *H05K 2201/10522* (2013.01)

(58) Field of Classification Search
CPC ...... H05K 1/0298; H05K 1/115; H05K 1/185
USPC .................. 361/761, 762, 763, 766, 770, 361/306.1–306.3; 174/260, 520
See application file for complete search history.

(56) References Cited

U.S. PATENT DOCUMENTS

| | | | |
|---|---|---|---|
| 6,535,398 B1* | 3/2003 | Moresco | H01L 23/50 257/700 |
| 2011/0031611 A1* | 2/2011 | Standing | H01L 23/5389 257/700 |
| 2015/0138741 A1* | 5/2015 | Moon | H05K 1/185 361/762 |
| 2015/0162339 A1* | 6/2015 | Divakaruni | H01L 27/11521 257/321 |
| 2015/0268461 A1* | 9/2015 | Murarka | G02B 26/0833 359/224.1 |

* cited by examiner

*Primary Examiner* — Yuriy Semenenko
(74) *Attorney, Agent, or Firm* — NSIP Law

(57) ABSTRACT

An electronic component embedded substrate is disclosed. The electronic component embedded substrate in accordance with an embodiment of the present invention includes: a core substrate having a cavity formed therein; a plurality of electronic components embedded in the cavity and arranged in a predetermined format; and a plurality of dielectric spacers interposed in between the plurality of electronic components that are adjacent to one another in the cavity.

6 Claims, 5 Drawing Sheets

ELECTRONIC COMPONENT EMBEDDED SUBSTRATE

CROSS-REFERENCE TO RELATED APPLICATIONS

This application claims the benefit of Korean Patent Application No. 10-2013-0169246, filed with the Korean Intellectual Property Office on Dec. 31, 2013, the disclosure of which is incorporated herein by reference in its entirety.

BACKGROUND

1. Technical Field

The present invention relates to an electronic component embedded substrate.

2. Background Art

Electronic component embedded printed circuit boards are formed by an embedding process, in which after a cavity is formed in a core substrate, an electronic component is placed in the cavity, and the electronic component is fixed in the cavity using, for example, a filling material.

The electronic component embedded printed circuit boards have recently become smaller and had an increased number of installed parts therein in order to address electronic devices that have become more functional and more integrated. Moreover, the electronic component embedded printed circuit boards have a decreased size of cavity, with each cavity having an increased number of parts embedded therein, in order to improve the freedom of circuit design. However, defects are often occurred by short circuit caused by the embedded parts contacting with one another while the electronic component embedded printed circuit boards is fabricated.

The related art of the present invention is disclosed in Korea Patent Publication No. 2011-0006252.

SUMMARY

The present invention provides an electronic component embedded substrate having a spacer coupled to an electronic component so as to prevent a defect caused by a contact between embedded parts due to a movement of an embedded part.

An aspect of the present invention features an electronic component embedded substrate that includes: a core substrate having a cavity formed therein; a plurality of electronic components embedded in the cavity and arranged in a predetermined format; and a plurality of dielectric spacers interposed in between the plurality of electronic components that are adjacent to one another in the cavity.

DETAILED DESCRIPTION

Figure 1:
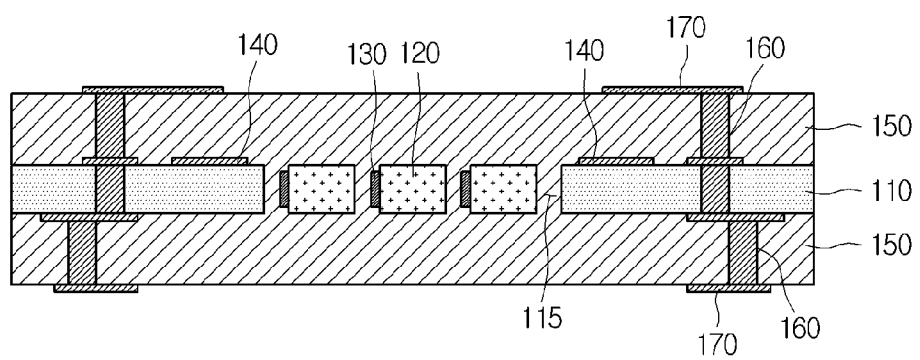
FIG. 1 is a cross-sectional view showing a structure of an electronic component embedded substrate in accordance with an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in a singular form include a meaning of a plural form. In the present description, an expression such as "comprising" or "including" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, certain embodiments of an electronic component embedded substrate will be described in detail with reference to the accompanying drawings. In describing certain embodiments of the present invention with reference to the accompanying drawings, any identical or corresponding elements will be assigned with same reference numerals, and their redundant description will not be provided.

FIG. 1 is a cross-sectional view showing a structure of an electronic component embedded substrate in accordance with an embodiment of the present invention.

Figure 2:
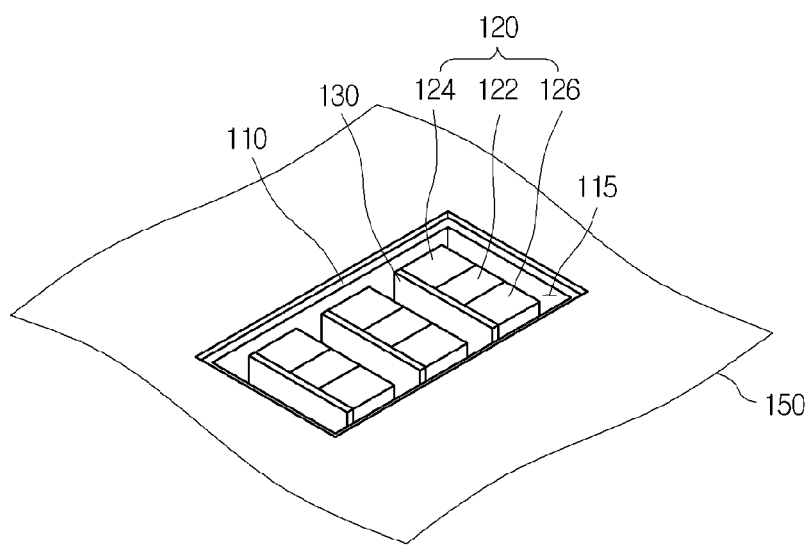
FIG. 2 shows an internal structure of the electronic component embedded substrate shown in FIG. 1.

FIG. 2 shows an internal structure of the electronic component embedded substrate shown in FIG. 1.

Referring to FIGS. 1 and 2, the electronic component embedded substrate in accordance with an embodiment of the present invention includes a core substrate 110, a plurality of electronic components 120, a dielectric spacer 130, a first circuit pattern 140, a dielectric layer 150, a via hole 160 and a second circuit pattern 170.

The cores substrate 110 includes a cavity 115 formed by perforating a portion of a dielectric resin layer. Here, the core substrate 110 can be made of a reinforcement base material and resin. Moreover, the cavity 115 can be formed in a size that corresponds to a size of the electronic components or is greater than the size of the electronic components 120, in order to accommodate the plurality of electronic components 120.

The plurality of electronic components 120 can be electrically connected with an outside to perform predetermined functions. In the electronic component embedded substrate in accordance with an embodiment of the present invention, the electronic component 120 can be a multi-layer ceramic capacitor that includes a body 122, a first external electrode 124 and a second external electrode 126. Nevertheless, the electronic component 120 is not limited to what is described herein, and a wide variety of products can be applied for the electronic component 120.

The plurality of electronic components 120 can be mounted inside the cavity 115. Here, the plurality of electronic components 120 can be arranged in a predetermined format inside the cavity 115. For example, the plurality of electronic components 120 can be arranged inside the cavity 115 in such a way that the first external electrode 124 and the second external electrode 126 of every electronic component 120 are respectively on same sides. In such a case, the plurality of electronic components 120 can be arranged in such a way that the first external electrodes 124 or the second external electrodes 126 are adjacent to one another.

The dielectric spacer 130 prevents electrical connection between the plurality of electronic components 120. Here, dielectric spacer 130 can be made of a dielectric material. The dielectric spacer 130 can be made of a same material as or a different material from the dielectric layer 150. For example, the dielectric spacer 130 can be made of resin, polymer or paster that includes prepreg, epoxy or polyimide. The dielectric spacer 130 can be formed in a spherical shape. Alternatively, the dielectric spacer 130 can be formed in a circular, elliptical or polygonal three-dimensional figure.

The dielectric spacer 130 can be interposed between the plurality of electronic components 120 that are adjacent with one another in the cavity 115. Particularly, the dielectric spacer 130 can be coupled to at least one of the plurality of adjacent electronic components 120. For example, the dielectric spacer 130 can be coupled to at least one lateral surface of each of the plurality of electronic components 120. Here, the dielectric spacer 130 can be coupled to at least one of the body 122, the first external electrode 124 and the second external electrode 126 of the electronic component 120. Alternatively, the dielectric spacer 130 can be coupled to at least one lateral surface of the electronic component 120 that is interposed in the middle of the plurality of parallel arranged electronic components 120 in the cavity 115. Alternatively, the dielectric spacer 130 can be each coupled to the first external electrode 124 or the second external electrode 126 of the two electronic components 120 arranged parallel in the cavity 115 and one electronic component 120 that is adjacently arranged on one side or the other side of the two electronic components 120.

The dielectric spacer 130 can be coupled to the plurality of electronic components 120 in the form of film, paster or liquid-phase or through vacuum evaporation.

The dielectric spacer 130 can be formed in a size for being coupled to an entire lateral surface of each of the plurality of electronic components 120. Alternatively, the dielectric spacer 130 can be formed in a size for being coupled to a portion of the lateral surface of each of the plurality of electronic components 120.

The first circuit pattern 140 can be formed in a predetermined pattern on at least one surface of the core substrate 110 in order to transmit an electrical signal. Here, the first circuit pattern 140 can be made of a conductive material having an excellent electric conductivity.

The dielectric layer 150 can be laminated on at least one surface of the core substrate 110. Here, the dielectric layer 150 can protect the electronic component 120 by filling the cavity 115. The dielectric layer 150 can fix the electronic component 120 at a position by enveloping the electronic component 120. The dielectric layer 150 can be made of a dielectric material, for example, prepreg.

The via hole 160 can electrically connect the first circuit pattern 140 with the second circuit pattern 170. Here, the via hole 160 can connect the first circuit pattern 140 with the second circuit pattern 170 by penetrating the dielectric layer 150. Moreover, the via hole 160 can also connect the electronic component 120 with the second circuit pattern 170.

The second circuit pattern 170 can be electrically connected with an outside and can transfer an electrical signal to the first circuit pattern 140. For this, the second circuit pattern 170 can be formed on the dielectric layer 150.

Figure 3:
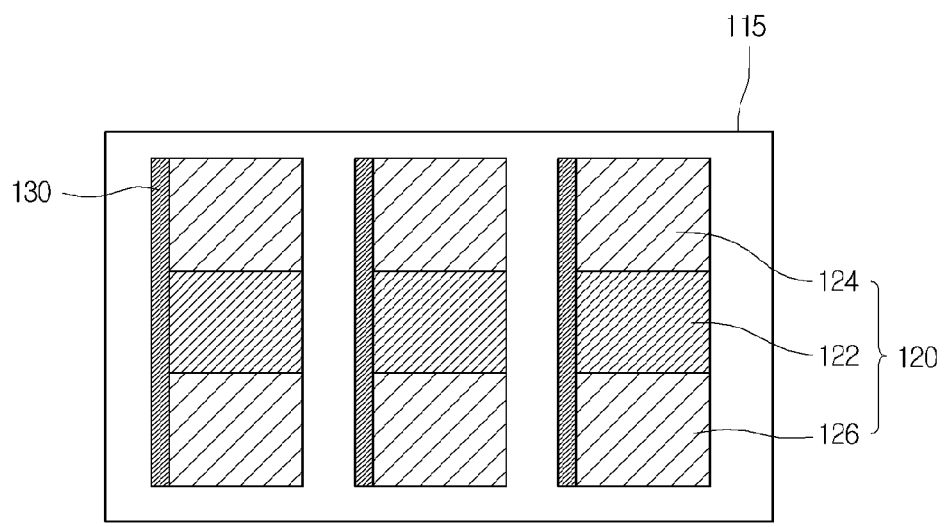
FIG. 3 shows arrangement of electronic components in the electronic component embedded substrate in accordance with an embodiment of the present invention.

FIG. 3 shows arrangement of the electronic components in the electronic component embedded substrate in accordance with an embodiment of the present invention.

Referring to FIG. 3, the electronic component embedded substrate in accordance with an embodiment of the present invention can have the dielectric spacer 130 coupled to one lateral surface of each of the plurality of electronic components 120. Here, the dielectric spacer 130 can be coupled to the body 122, the first external electrode 124 and the second external electrode 126 of the electronic component 120. The dielectric spacer 130 can be coupled to the one lateral surface of the electronic component 120 in the form of film, paster or liquid-phase or through vacuum evaporation.

FIGS. 4 to 9 show arrangements of the electronic components in the electronic component embedded substrate in accordance with other embodiments of the present invention.

Figure 4:
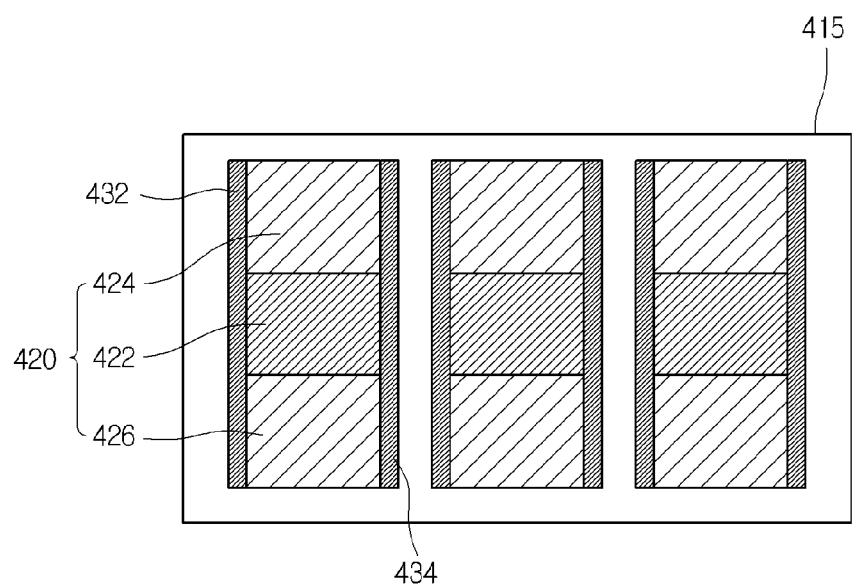
FIGS. 4 to 9 show arrangements of electronic components in the electronic component embedded substrate in accordance with other embodiments of the present invention.

Referring to FIG. 4, the electronic component embedded substrate in accordance with another embodiment of the present invention can have a first dielectric spacer 432 and a second dielectric spacer 434 to each of a plurality of electronic components 420.

Here, the first dielectric spacer 432 and the second dielectric spacer 434 can be each coupled to a body 422, a first external electrode 424 and a second external electrode 426 of the electronic component 420. The first dielectric spacer 432 and the second dielectric spacer 434 can be each coupled to both lateral surfaces of the electronic component 420 in the form of film, paster or liquid-phase or through vacuum evaporation.

Figure 5:
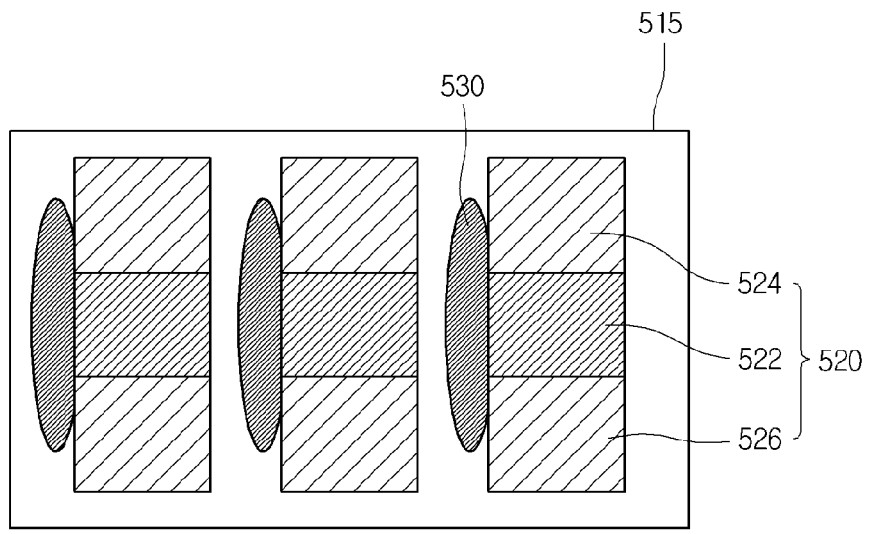

Referring to FIG. 5, the electronic component embedded substrate in accordance with yet another embodiment of the present invention can have a dielectric spacer 530 coupled partially to one lateral surface of each of a plurality of electronic components 520. Here, the dielectric spacer 530 can be formed in a circular, elliptical or polygonal three-dimensional figure. The dielectric spacer 530 can be coupled to at least one of a body 522, a first external electrode 524 and a second external electrode 526 of the electronic component 520. For example, the dielectric spacer 530 can be formed to be shorter than the electronic component 520 and can be coupled to the one lateral surface of the electronic component 520 while covering the body 522, the first external electrode 524 and the second external electrode 526.

Figure 6:
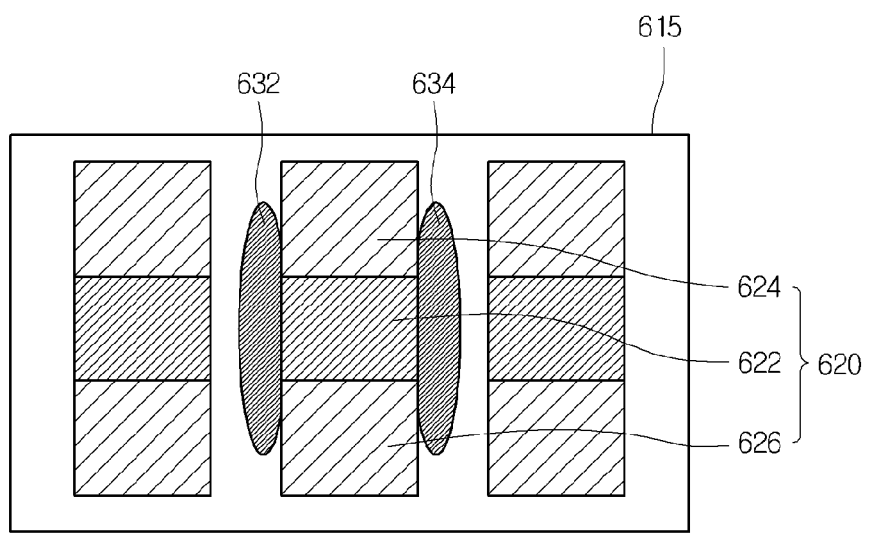

Referring to FIG. 6, the electronic component embedded substrate in accordance with still another embodiment of the present invention can have a first dielectric spacer 632 and a second dielectric spacer 634 coupled to either lateral surface of every even ordinal number arranged electronic component 620 among an odd number of electronic components 620 that are arranged parallel in a cavity 615.

Here, the first dielectric spacer 32 and the second dielectric spacer 634 can be each coupled to a body 622, a first external electrode 624 and a second electrode 626 of the electronic component 620. Here, the first dielectric spacer 632 and the second dielectric spacer 634 can be each formed in a circular, elliptical or polygonal three-dimensional figure. Each of the first dielectric spacer 632 and the second dielectric spacer 634 can be couple to at least one of the body 622, the first external electrode 624 and the second electrode 626 of the electronic component 620. For example, each of the first dielectric spacer 632 and the second dielectric spacer 634 can be formed to be shorter than the electronic component 620 and can be coupled to either lateral surface of the electronic component 620 while covering the body 622, the first external electrode 624 and the second external electrode 626.

Figure 7:
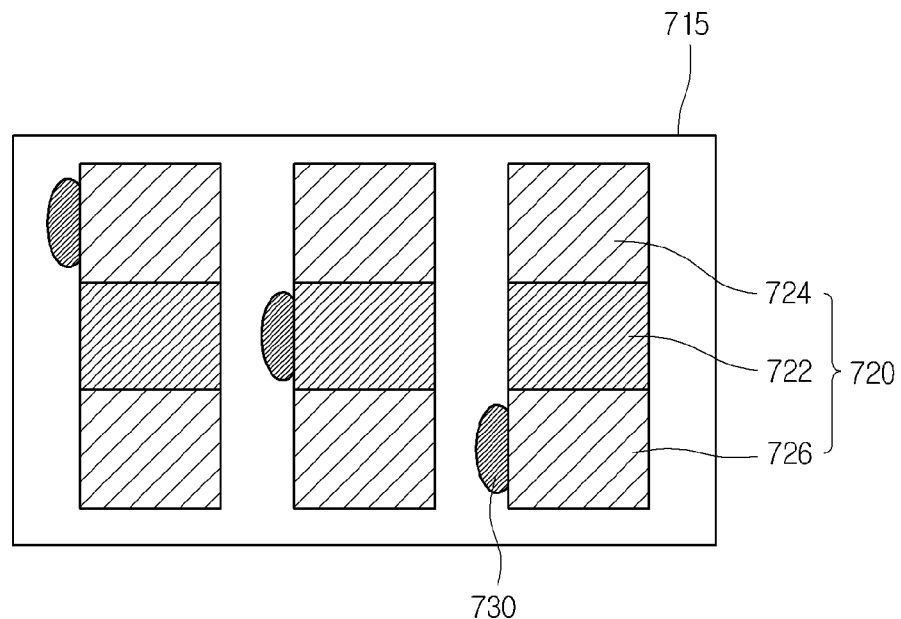

Referring to FIG. 7, the electronic component embedded substrate in accordance with still yet another embodiment of the present invention can have a dielectric spacer 730 coupled partially to one lateral surface of each of a plurality of electronic components 720.

Here, the dielectric spacer 730 can be coupled to a selected portion among a body 722, a first external electrode 724 and a second external electrode 726 of each of the plurality of electronic components 720 that are arranged parallel in a cavity 715. For example, the dielectric spacer 730 can be coupled to the first external electrode 724 of the first of the electronic components 720 arranged parallel in the cavity 715. Moreover, the dielectric spacer 730 can be coupled to the body 722 of the second of the electronic components 720 arranged parallel in the cavity 715. Furthermore, the dielectric spacer 730 can be coupled to the second external electrode 726 of the third of the electronic components 720 arranged parallel in the cavity 715.

Here, the dielectric spacer 730 can be coupled to the one lateral surface of each of the plurality of electronic components 720 so as to cover a selected portion of each of the body 722, the first external electrode 724 and the second external electrode 726. The dielectric spacer 730 can be formed in a circular, elliptical or polygonal three-dimensional figure.

Figure 8:
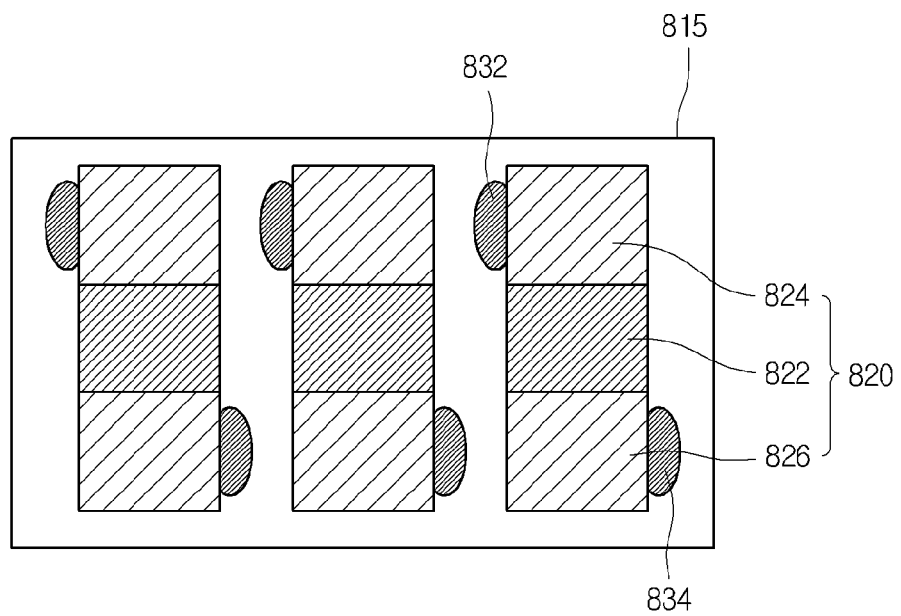

Referring to FIG. 8, the electronic component embedded substrate in accordance with yet another different embodiment of the present invention can have a first dielectric spacer 832 and a second dielectric spacer 834 coupled partially to either lateral surface of each of a plurality of electronic components 820.

Here, the first dielectric spacer 832 and the second dielectric spacer 834 can be each coupled to a first external electrode 824 and a second external electrode 826, respectively, of each of the plurality of electronic components 820 that are arranged parallel in a cavity 815.

Here, the first dielectric spacer 832 and the second dielectric spacer 834 can be each coupled to the one lateral surface of each of the plurality of electronic components 820 so as to cover a selected portion of each of the first external electrode 824 and the second external electrode 826. The first dielectric spacer 832 and the second dielectric spacer 834 can be each formed in a circular, elliptical or polygonal three-dimensional figure.

Figure 9:
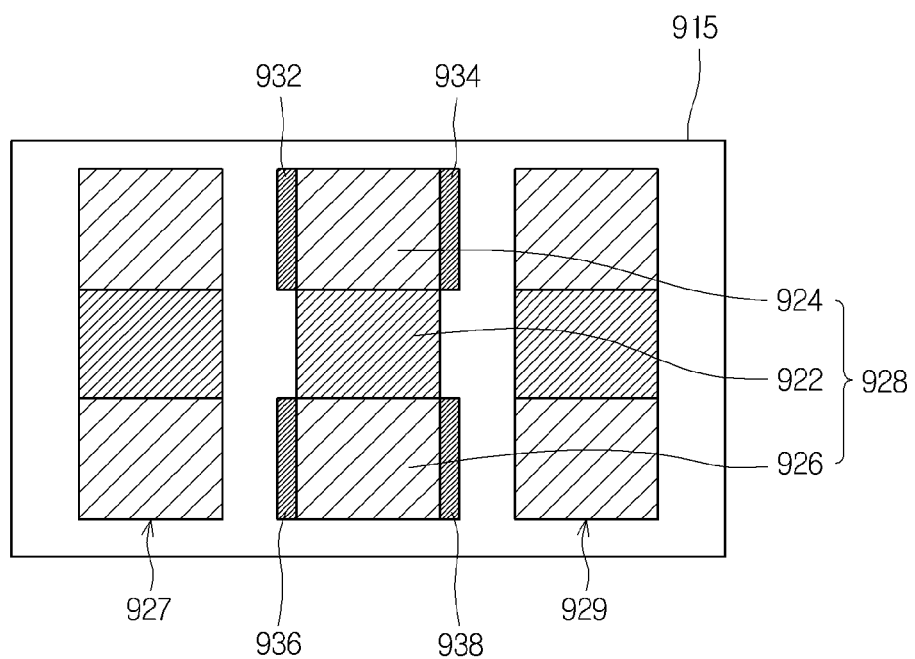

Referring to FIG. 9, the electronic component embedded substrate in accordance with still yet another different embodiment of the present invention can have a first dielectric spacer 932, a second dielectric spacer 934, a third dielectric spacer 936 and a fourth dielectric spacer 938 coupled to either lateral surface of a first external electrode 924 and a second external electrode 926 of every even ordinal number arranged electronic component 920 among an odd number of electronic components 920 that are arranged parallel in a cavity 915.

Here, the first dielectric spacer 932 and the second dielectric spacer 934 can be coupled to either lateral surface of the first external electrode 924 of the electronic component 920. Moreover, the third dielectric spacer 936 and the fourth dielectric spacer 938 can be coupled to either lateral surface of the second external electrode 926 of the electronic component 920.

Although certain embodiments of the present invention have been described, it shall be appreciated that there can be a very large number of permutations and modification of the present invention by those who are ordinarily skilled in the art to which the present invention pertains without departing from the technical ideas and boundaries of the present invention, which shall be defined by the claims appended below.

It shall be also appreciated that many other embodiments other than the embodiments described above are included in the claims of the present invention.

What is claimed is:

1. An electronic component embedded substrate, comprising:
   a core substrate having a cavity formed therein;
   a plurality of electronic components embedded in the cavity and arranged in a predetermined format; and
   a plurality of dielectric spacers interposed in between the plurality of electronic components that are adjacent to one another in the cavity.

2. The electronic component embedded substrate of claim 1, wherein the dielectric spacers are each coupled to one lateral surface of each of the plurality of electronic components.

3. The electronic component embedded substrate of claim 1, wherein each of the plurality of dielectric spacers comprises a first dielectric spacer and a second dielectric spacer that are coupled to each of the plurality of electronic components, and
   wherein each of the first dielectric spacer and the second dielectric spacer is coupled to a body, a first external electrode and a second external electrode of each of the plurality of electronic components.

4. The electronic component embedded substrate of claim 1, wherein each of the dielectric spacers is coupled partially to one lateral surface of each of the plurality of electronic components, and
   wherein each of the dielectric spacers is coupled to at least one of a body, a first external electrode and a second external electrode of each of the plurality of electronic components.

5. The electronic component embedded substrate of claim 1, wherein a first dielectric spacer and a second dielectric spacer are coupled to either lateral surface of every even ordinal number arranged electronic component among an odd number of electronic components that are arranged parallel in the cavity, and
   wherein each of the first dielectric spacer and the second dielectric spacer is coupled to a body, a first external electrode and a second dielectric electrode of each of the electronic components.

6. The electronic component embedded substrate of claim 1, wherein each of the dielectric spacers is coupled partially to one lateral surface of each of the plurality of electronic components that are arranged parallel in the cavity, and
   wherein each of the dielectric spacers is coupled to one selected portion of each of a body, a first external electrode and a second dielectric electrode of each of the electronic components.

* * * * *